United States Patent
Degani et al.

(10) Patent No.: US 7,936,043 B2
(45) Date of Patent: May 3, 2011

(54) INTEGRATED PASSIVE DEVICE SUBSTRATES

(75) Inventors: Yinon Degani, Highland Park, NJ (US);
Yu Fan, Dallas, TX (US); Charley Chunlei Gao, Plano, TX (US); Maureen Lau, Warren, NJ (US); Kunquan Sun, Plano, TX (US); Liguo Sun, Plano, TX (US)

(73) Assignee: Sychip Inc., Plano, TX (US)

( * ) Notice: Subject to any disclaimer, the term of this patent is extended or adjusted under 35 U.S.C. 154(b) by 399 days.

(21) Appl. No.: 11/378,106

(22) Filed: Mar. 17, 2006

(65) Prior Publication Data

US 2007/0215976 A1  Sep. 20, 2007

(51) Int. Cl.
*H01L 29/00* (2006.01)
(52) U.S. Cl. .................... 257/528; 257/532

(58) Field of Classification Search .......... 257/528–543, 257/E27.114
See application file for complete search history.

(56) References Cited

U.S. PATENT DOCUMENTS

| | | | | |
|---|---|---|---|---|
| 5,559,349 | A * | 9/1996 | Cricchi et al. | 257/273 |
| 6,667,491 | B2 * | 12/2003 | Yoneda | 257/19 |
| 6,777,774 | B2 * | 8/2004 | Beng et al. | 257/531 |
| 2003/0067052 | A1 * | 4/2003 | Matsuo et al. | 257/531 |
| 2004/0087099 | A1 * | 5/2004 | Contopanagos et al. | 438/381 |
| 2005/0017346 | A1 * | 1/2005 | Yamagata | 257/701 |

* cited by examiner

*Primary Examiner* — Cuong Q Nguyen
(74) *Attorney, Agent, or Firm* — Peter V.D. Wilde

(57) ABSTRACT

The specification describes an integrated passive device (IPD) that is formed on a silicon substrate covered with an oxide layer. Unwanted accumulated charge at the silicon/oxide interface are rendered immobile by creating trapping centers in the silicon surface. The trapping centers are produced by a polysilicon layer interposed between the silicon substrate and the oxide layer.

5 Claims, 5 Drawing Sheets

INTEGRATED PASSIVE DEVICE SUBSTRATES

FIELD OF THE INVENTION

This invention relates to integrated passive devices (IPDs) and more specifically to IPDs formed on silicon substrates.

BACKGROUND OF THE INVENTION (Portions of the technical material contained in this section may not be prior art.)

State of the art radio frequency (RF) electrical circuits use large quantities of passive devices. Many of these circuits are used in hand held wireless products. Accordingly, miniaturization of passive devices and passive device circuits is an important goal in RF device technology.

Integration and miniaturization of passive devices on the scale of active silicon devices has not occurred for at least two reasons. One, typical passive devices to date employ different material technologies. But, more fundamentally, the size of many passive devices is a function of the frequency of the device, and thus is inherently relatively large. However, still, there is unrelenting pressure to produce more compact and area efficient IPDs.

Significant advances have been achieved. In many cases these involve surface mount technology (SMT). Small substrates containing large numbers of passive components are routinely produced using surface mount technology.

More recent advances in producing integrated passive device networks involve thin film technology where resistors capacitors and inductors are built as integrated thin film devices on a suitable substrate. See for example U.S. Pat. No. 6,388,290, incorporated herein by reference. This approach is being used widely in advanced technology products.

With increasing miniaturization, and continuing shrinking of IPD dimensions and features, electrical interactions between the IPD substrate and the passive devices mounted on the substrate are of growing concern. U.S. patent application Ser. No. 10/277,239, filed Oct. 21, 2002 addresses these issues, and describes and claims a high resistivity IPD substrate that offers processing advantages coupled with the desired dielectric properties. This substrate can also be made thin, to reduce the profile of the IPD. The substrate described in the aforementioned application is intrinsic silicon, with an oxide layer on the surface of the silicon. When the oxide layer is made thin, as in the preferred embodiments described in that application, charge build-up occurs in the interface between the high resistivity substrate and the oxide layer. The combination of the high resistivity substrate and the oxide layer behaves as a so-called dual dielectric, a structure well known for creatively employing charge storage effects. The charge accumulates at the interface, and the electric field produced by the accumulated charge influences both the substrate characteristics and the characteristics of electrical devices on the substrate.

If the accumulated charge is substantial, the silicon substrate appears as if semiconducting, creating an MOS structure. When the surface mounted IPD device is a capacitor for example, the MOS structure acts as an added series capacitor, and degrades the capacitor performance. Moreover, if the accumulated charge renders the substrate semiconducting, the performance of all of the IPD components on the surface is impaired due to the reduced resistivity of the entire substrate.

A significant part of these adverse effects on passive components in the IPD device is due to the fact that much of the accumulated charge just described is mobile. Due to the mobility of the accumulated charge, the adverse electric field effects from the accumulated charge varies with applied voltage. Consequently, while the occurrence of charge states in the silicon/silicon oxide interface is difficult to avoid, the adverse field effects of the accumulated charge may be reduced by fixing the charge in charge traps in the silicon.

One approach to creating charge traps and fixing the mobile charge at the interface is described by Janseman et al., "Elimination of accumulation charge effects for High-Resistivity Silicon Substrates" [reference] Janseman et al. create ion implantation damage in a surface layer of the silicon substrate. It is well known that ion implantation damage reduces charge mobility in silicon due to the creation of crystal damage and the production of charge trapping sites.

Other approaches that improve the surface characteristics at the silicon/silicon oxide interface would contribute new dimensions to IPD technology.

SUMMARY OF THE INVENTION

We have developed an improved IPD substrate that addresses problems with accumulation of mobile charge carriers at or near the surface of an IPD substrate. The improved substrate has a layer of polysilicon added between the intrinsic silicon substrate and the surface oxide. As known in the art, typical silicon substrates are at least lightly doped. In terms of commercially available silicon material, a standard silicon wafer will have a resistivity of approximately 5-30 ohm cm. Reference to intrinsic silicon material in connection with this invention is intended to mean silicon having a resistivity higher than 500 ohm cm, and preferably higher than 1000 ohm cm. Resistivity values of 4000 ohm cm or higher are also contemplated. The surface oxide is preferably silicon dioxide, but other oxides may be used, such as tantalum oxide, titanium oxide, etc. The polysilicon layer contains a high density of stable charge carrier traps due to the large number of crystal defects in the polysilicon layer. Charge that accumulates at the $Si/SiO_2$ interface is converted from mobile charge to fixed charge by these traps.

DETAILED DESCRIPTION

Figure 1:
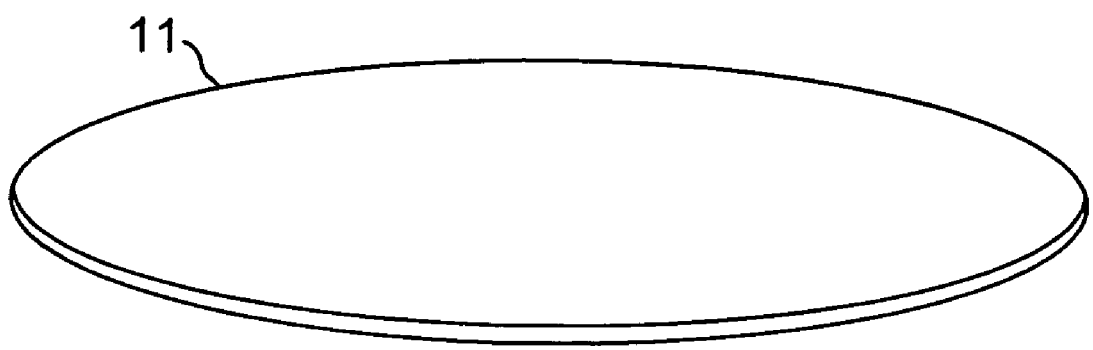
FIG. 1 shows a single crystal silicon starting wafer for preparing the IPD substrate of the invention.

FIG. 1 is a view of a silicon wafer 11. The substrate wafer is a single crystal silicon wafer cut from a boule, and has properties described earlier, in particular, intrinsic resistivity. In this description, reference to silicon means single crystal silicon. Silicon wafers are produced in many sizes, but typically the larger the diameter of the wafer, the lower the potential device cost. Currently, silicon wafers are available in diameters up to twelve inches. With twelve inch wafers state of the art, that size will be used as the example in the following description. It should be understood that smaller wafers, for example 6" or 8", are also useful. The single crystal wafer has useful attributes for an IPD substrate wafer. It is typically thin (e.g. 200-700 microns), but is robust physically, and can be handled and processed. It is very flat over a large area. It has a highly polished uniformly smooth surface. And it is compatible with silicon wafer fabrication processes and tools.

Figure 2:
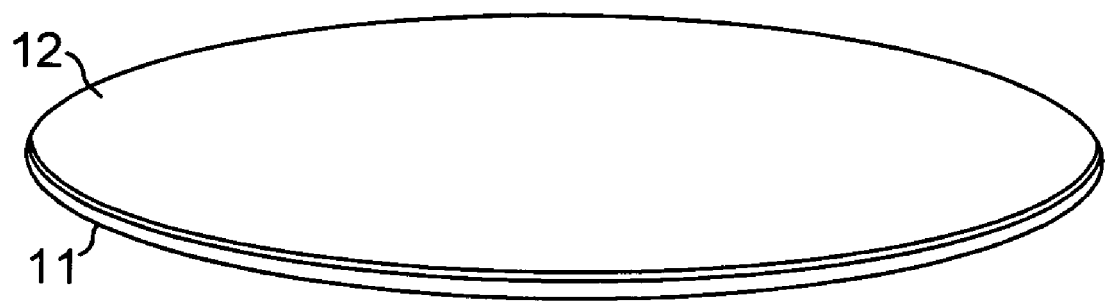
FIG. 2 shows the silicon wafer with polysilicon deposited.

Using the silicon wafer as the substrate wafer, a layer of polysilicon 12 is deposited on the surface of wafer 11, as shown in FIG. 2.

The thickness of the polysilicon layer may vary widely, as long as a required minimum is present to provide the charge trapping centers necessary to at least partially achieve the goal of the invention. Any thickness of polysilicon will produce a useful result, i.e. will provide some trapping centers, but it is preferred that the polysilicon layer be at least 0.1 microns, and preferably 0.2 microns. The maximum thickness for the polysilicon layer is less important, and may be governed mostly by considerations such as cost and convenience. Since polysilicon can be easily deposited to have a very high resistivity, near to or greater than that of the intrinsic silicon substrate, the polysilicon layer thickness is not necessarily constrained by resistivity considerations. Polysilicon may be produced with a resistivity of more than 10 KOhm-cm. In the context of the invention, resistivity values of more than 0.1 KOhm-cm, and preferably more than 1 KOhm-cm are desired. That allows the polysilicon layer thickness to be substantial, e.g. 50 microns. However, the stress effects mentioned above may also influence the polysilicon layer thickness, suggesting that the layer be substantially less than 50 microns. No advantage is seen in making the polysilicon layer thicker than 3.0 microns.

To complete the IPD substrate of the invention, an insulating layer is formed on the surface of the silicon/polysilicon composite substrate. The insulating layer may be any high dielectric material, but is preferably grown or deposited $SiO_2$, or deposited $Si_3N_4$. The thickness of the insulating layer may vary substantially. For $SiO_2$, a thickness in the range 0.1-5 microns is recommended.

As described in more detail below, the main processing steps required to produce the IPDs are conducted at the wafer level. After these steps are completed it may be desirable to thin the wafer to produce IPD devices with smaller profiles. To accomplish this, part of the silicon wafer is removed using known wafer thinning techniques.

The method used to produce the polysilicon layers is preferably Low Pressure Chemical Vapor Deposition (LPCVD). This method, and CVD equipment for implementing the method, are widely used in industry. Briefly, the method commonly used for CVD polysilicon involves the pyrolysis of silane at modest temperatures, for example, 550-650° C. Polysilicon is used in nearly every MOS transistor made, and is thus one of the most common industrial materials known. Consequently, the electrical and physical properties of polysilicon are also well known. Though it is intrinsically highly resistive, as just described, it is typically processed by ion implantation to reduce the resistivity for IC applications. It is rarely used in its intrinsic form. Thick, wide-area, polysilicon layers have also been used in solar cells, or photocells. Here again, the polysilicon layers are typically implanted with ions to form diode structures.

In the application to be described below, the polysilicon substrate is used in its intrinsic state, and uniform high resistivity across the substrate is a desired property.

Since the technology of CVD polysilicon is so well developed, CVD is the preferred choice for forming the polysilicon layers 12 and 13. However, other methods may be found useful. For example, methods are known for e-beam evaporation of polysilicon. Any suitable alternative for forming a thick, wide area, low resistivity, polysilicon substrate layer is within the scope of the invention.

Figure 3:
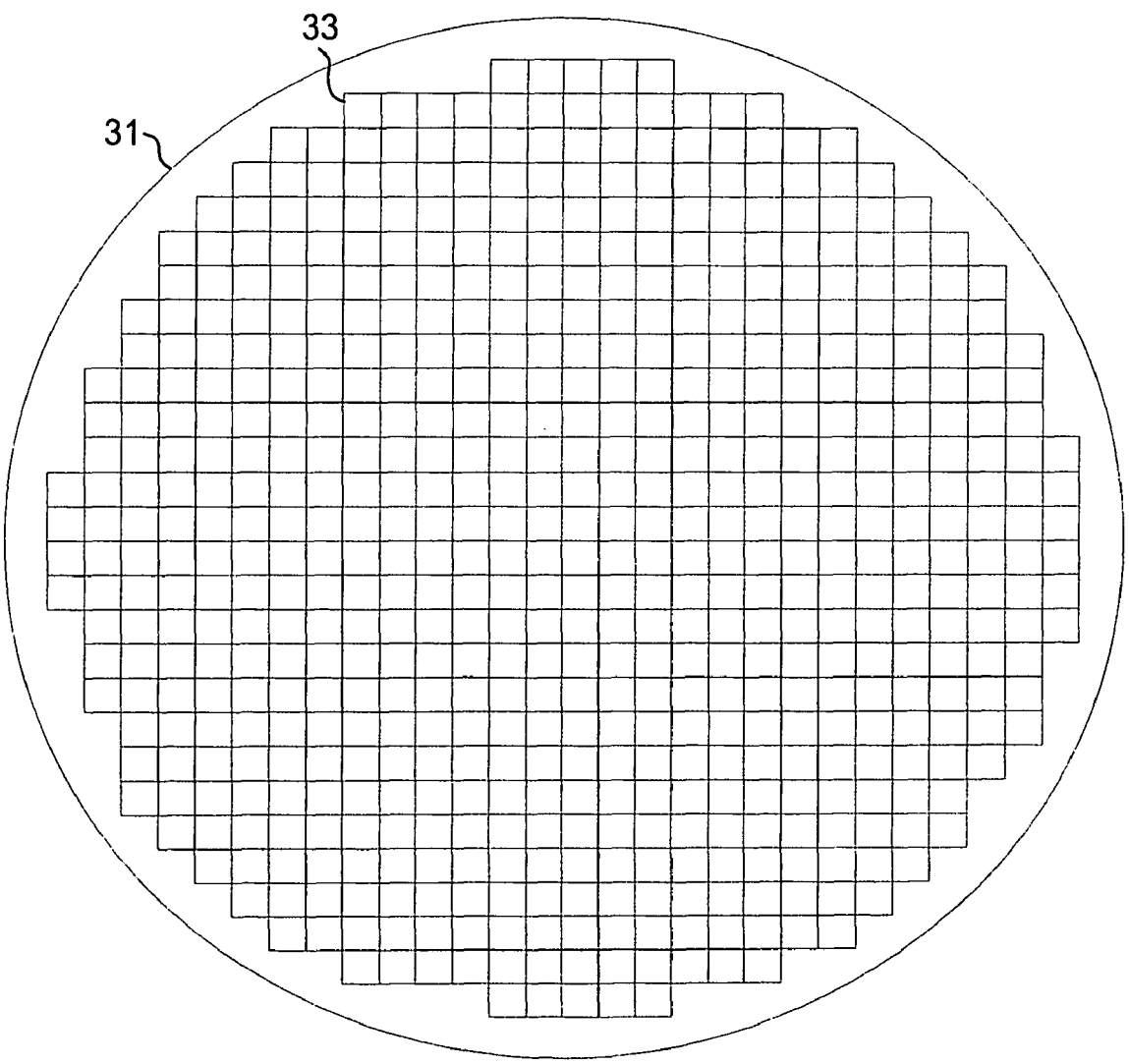
FIG. 3 is a view of the polysilicon wafer of the invention showing over 500 IPD sites for building thin film IPDS.

The IPD production approach described here is aimed at wafer scale device fabrication. In this approach, a large number of finished, or nearly finished, devices are produced on the polysilicon wafer. After fabrication is essentially complete, the wafer is diced into IPD chips. As the size of wafers increases, and IPD chip size shrinks, wafer level fabrication becomes ever more attractive. FIG. 3 shows a twelve inch wafer 31, which is capable of providing more than 500 device sites 33. (For simplicity, the wafer flat or notch is not shown.) Each site is approximately a centimeter square, easily large enough to accommodate an IPD.

Figure 4:
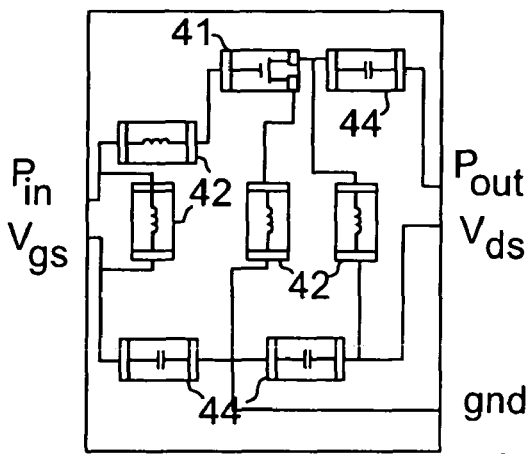
FIG. 4 is a schematic section view of a typical IPD showing conventional SMT components mounted on a conventional substrate.

The effectiveness of wafer scale fabrication can be multiplied using thin film fabrication approaches for forming the passive devices. A common prior art approach, even at the wafer level, is to mount and attach discrete passive elements to the wafer substrate. Typically this is done using surface mount technology (SMT). FIG. 4 shows this method as applied to the IPD circuit illustrated in FIG. 3 of U.S. Pat. No. 6,388,290, referenced earlier. This circuit is not strictly an IPD because it contains an active element, i.e. MOS transistor 41. However, for reasons that will become apparent below, it is a useful illustration. The circuit may be considered a hybrid circuit having an active portion and a passive portion. Here we will be concerned mainly with the passive portion, i.e. the portion that contains four inductors 42 and three capacitors 44. As a matter of choice, that portion could be produced as an IPD. Although the circuit of FIG. 3 is useful here, and below, as a vehicle to illustrate the technology of the invention, a wide variety of circuits may be made using the invention. For another example, and one that may be more demanding from a high-Q standpoint, see Proceedings 1994 IEEE MULTI-CHIP MODULE CONFERENCE MCMC-94, PAGES 15-19, incorporated herein by reference.

Thin film passive elements may be formed by a variety of thin film techniques. These techniques are well developed and the specifics need not be reiterated here. See for example U.S. Pat. No. 6,075,691, issued Jun. 13, 2000, and U.S. Pat. No. 6,005,197, issued Dec. 21, 1999, both incorporated herein by reference. The latter patent describes a multi-layer structure for PCBs, which could easily be adapted for the application described here. A convenient way of defining a thin film passive device is a passive device that is formed on a substrate using one or more layers, typically a plurality of layers, deposited on the substrate.

Figure 5:
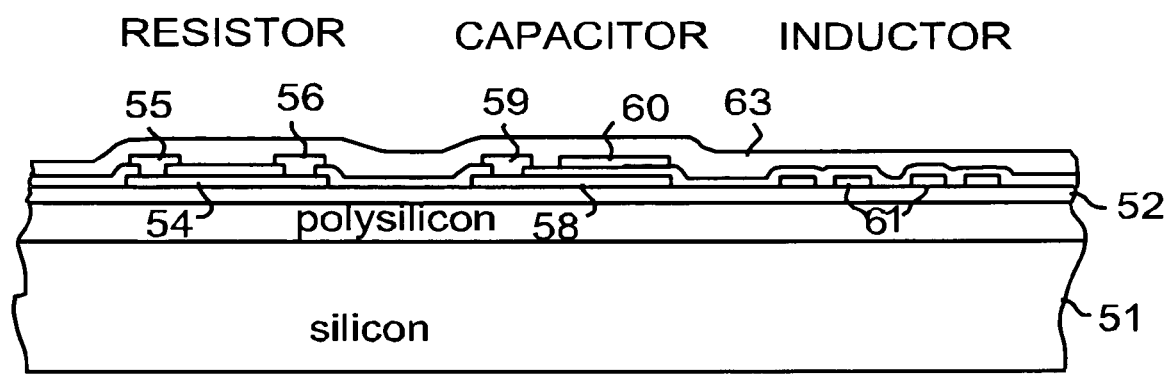
FIG. 5 is a schematic view of a thin film approach to IPD fabrication on one of the sites of the substrate of FIG. 3.

Thin film methods for producing single passive elements or combinations of interconnected passive elements are generically represented by FIG. 5, wherein the silicon/polysilicon substrate is shown at 51, with a grown oxide layer 52. Resistor body 54, formed from first level metal, has contacts 55 and 56, and lower capacitor plate 58, has contact 59. Both comprise buried levels. Upper capacitor plate 60, and inductor spiral 61, are formed last, with contacts not shown. The structure is protected with polyimide layer 63.

The substrate structure 51 of FIG. 5 is relatively thick, which reduces the risk of fracture and other damage during processing. After fabrication of the passive circuit elements, and completion of the IPD, the substrate 51 may be thinned to remove a portion of the single crystal silicon layer. The preferred thinning step uses chemical mechanical polishing. This well known process combines abrasive polishing with chemical etching. KOH or a suitable alternative etchant is used in the abrasive slurry.

Figure 6:
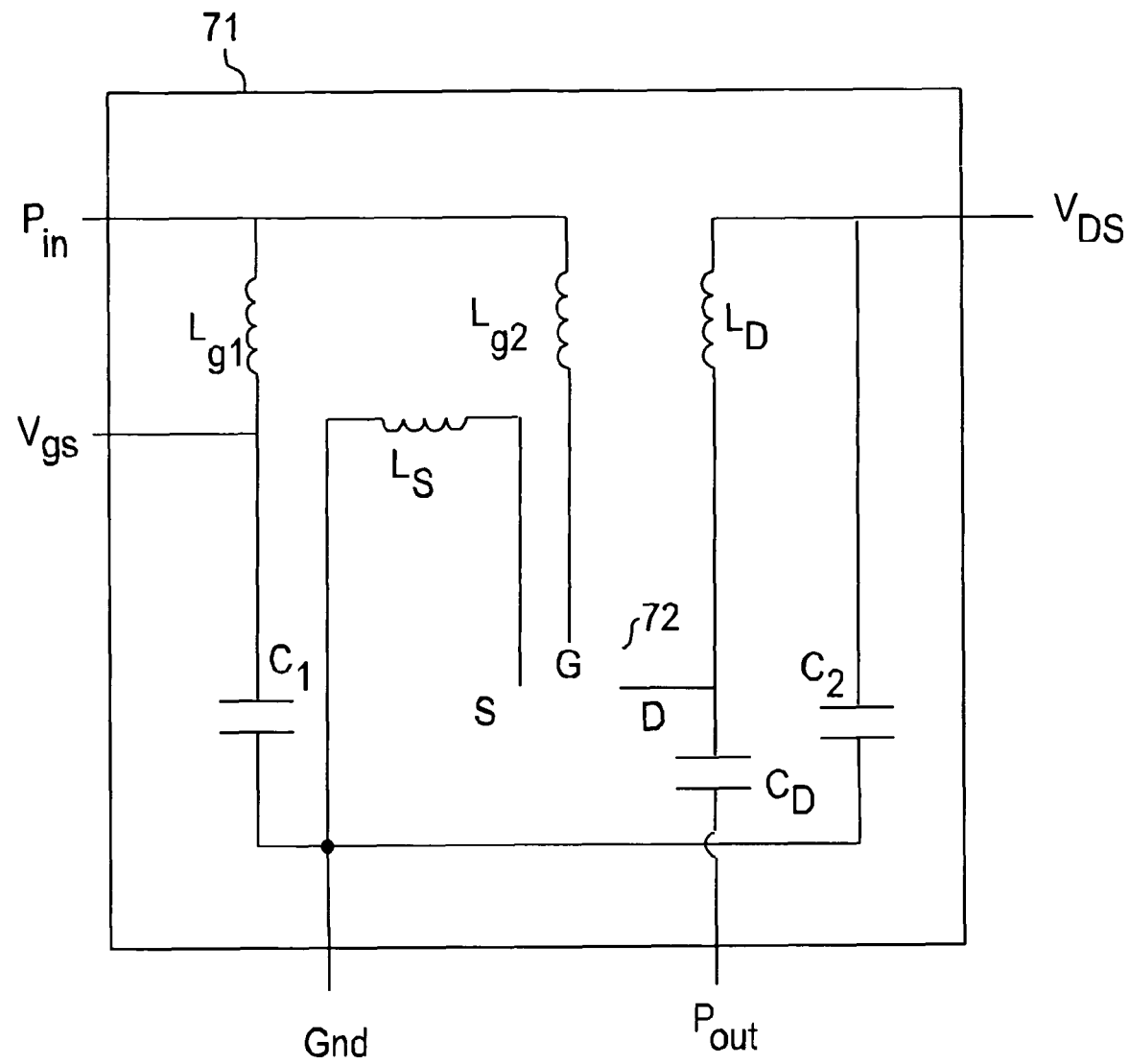
FIG. 6 is a schematic circuit diagram showing an example of an IPD.
Figure 7:
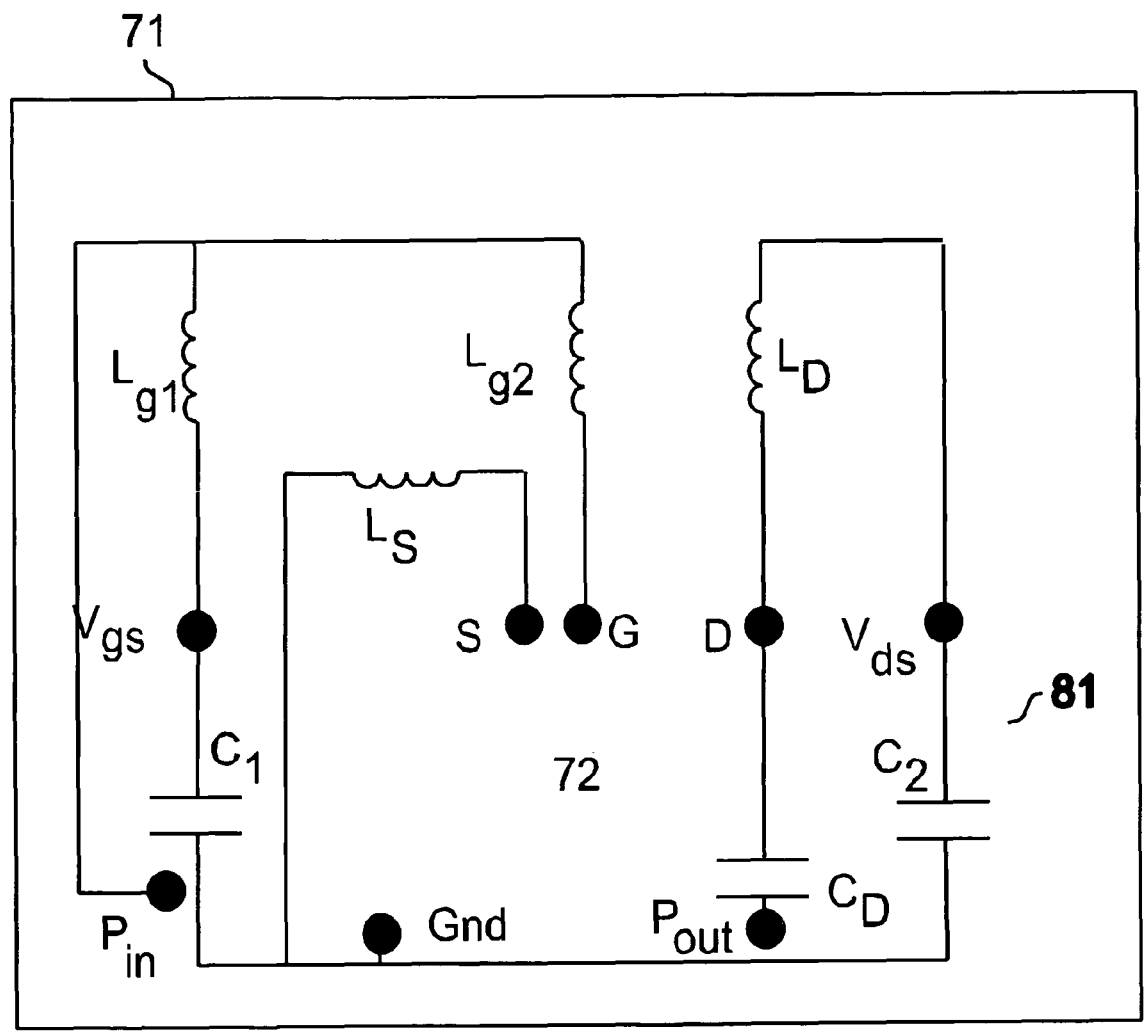
FIG. 7 shows the IPD with an active IC chip mounted on the IPD.

The IPD of FIG. 4 is shown implemented according to one embodiment of the invention in FIG. 6. The IPD is formed on one or more of the sites 33 shown in FIG. 3. (As is evident from this specification, and from FIG. 5, the term "on" means on top of and in contact with.) Polysilicon substrate 71 is shown with thin film inductors $L_{g1}$, $L_{g2}$, $L_S$ and $L_D$, and capacitors $C_1$, $C_2$, and $C_D$. MOS transistor 72 is shown in phantom because, while part of the schematic circuit, it is not formed in the IPD. The circuit layout for FIG. 7 is deliberately changed from that of FIG. 3. This circuit and this layout are for the purpose of illustrating a typical type of circuit having passive components. It is an example of a circuit taken from the prior art referenced earlier. No representation as to its effectiveness is made here.

The layout in FIG. 6 is designed with all the inductor elements grouped together. It is known that inductor elements are especially sensitive to ambient conditions, e.g. parasitic signals. This recognition is employed in the design of the active/passive module shown in FIG. 7. The polysilicon substrate 71, with the IPD shown in FIG. 6, has an active IC chip 81 flip-chip mounted over the top of the IPD as shown. Part of the active IC chip is transistor 72. The interconnections in this embodiment are shown as solder bumps for the electrical interconnections S, D, G, $V_{gs}$, $V_{DS}$, $P_{in}$, $P_{out}$, gnd. Off board interconnection sites (not shown) may be provided on the IPD substrate 71. One purpose of the grouping of the inductor devices as shown in FIG. 6 is evident in FIG. 7. The active IC chip is deliberately positioned so as not to overlay the sensitive inductor elements. Thus the stacked substrate arrangement is effectively implemented to save space and provide a compact device module, without compromising the performance of the inductor elements.

The improvement in IPD performance resulting from use of the invention was demonstrated by comparing the properties of three types of passive devices mounted on three different substrates. All three substrates are silicon, obtained from SEH America, a provider of single crystal silicon wafers. A first lot, designated A, had no special surface treatment. The second lot, designated B, was a silicon wafer with 0.5 microns of polysilicon. The third lot, designated C, was included to compare the other approach mentioned above for creating trapping centers. The C lot was a silicon wafer implanted using an Ar beam at 200 KeV at $10^{15}$ particles/square cm.

The three types of passive elements tested were a balun transformer (results given in Table 1), a bandpass filter (results given in Table 2), and a 1 mm 50 ohm trace (results given in Table 3).

Measurements were taken at different positions (different tiles or IPD sites) on the wafers. The different tiles are represented by location 3 (L3), location 7 (L7), location 8, (L8) and location 12 (L12).

TABLE 1

BALUN INSERTION LOSS (dB) COMPARISON AT 2.451 GHz

|   | L3 | L7 | L8 | L12 | Avg |
|---|---|---|---|---|---|
| A | −1.461 | −1.379 | −1.395 | −1.488 | −1.431 |
| B | −1.058 | −1.031 | −1.044 | −1.098 | −1.065 |
| C | −0.941 | −0.934 | −0.938 | −0.954 | −0.942 |

TABLE 2

FILTER INSERTION LOSS (dB) COMPARISON AT 2.451 GHz

|   | L3 | L7 | L8 | L12 | Avg |
|---|---|---|---|---|---|
| A | −1.595 | −1.576 | −1.565 | −1.527 | −1.566 |
| B | −1.357 | −1.379 | −1.392 | −1.341 | −1.367 |
| C | −1.277 | −1.326 | −1.229 | −1.251 | −1.251 |

TABLE 3

TRACE INSERTION LOSS (dB) COMPARISON AT 2.451 GHz

|   | L3 | L7 | L8 | 12 | Avg |
|---|---|---|---|---|---|
| A | −0.153 | −0.134 | −0.138 | −0.153 | −0.145 |
| B | −0.070 | −0.048 | −0.066 | −0.076 | −0.065 |
| C | −0.033 | −0.035 | −0.041 | −0.028 | −0.034 |

The measurements are experimental results and results in other experiments may vary quantitatively.

The results show that modifying the surface of the intrinsic silicon substrate with a deposited polysilicon layer is comparable in effectiveness with implanting the surface with argon. Moreover, the use of a deposited polysilicon layer may be expected to provide a more effective solution in terms of the stability of the interface. At least some of the implantation damage may be annealed removing some of the trapping centers when the wafer undergoes additional processing. The interface between the polysilicon and the overlying oxide can be more stable under those conditions.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. An integrated passive device (IPD) comprising:
   a. a silicon wafer substrate, the silicon wafer substrate having a resistivity of more than 0.1 KOhm-cm.,
   b. a polysilicon layer on the silicon wafer substrate, the polysilicon layer having a resistivity of more than 0.1 KOhm-cm., wherein the entire polvsilicon layer is in direct contact with the silicon wafer substrate,
   c. an insulating layer on the polysilicon layer, and
   d. at least one thin film inductor or capacitor on the insulating layer.

2. The IPD of claim 1 wherein the polysilicon layer has a thickness greater than 0.1 microns.

3. The IPD of claim 1 wherein the silicon wafer substrate has a resistivity of more than 1.0 KOhm-cm.

4. The IPD of claim 1 wherein the silicon wafer has a diameter of at least 8 inches.

5. The IPD of claim 1 comprising a plurality of inductors, and a plurality of passive resistor and/or capacitor devices.

* * * * *